(12) United States Patent
Ma

(10) Patent No.: US 7,033,188 B2
(45) Date of Patent: Apr. 25, 2006

(54) LAND GRID ARRAY CONNECTOR ASSEMBLY WITH PICK UP CAP

(75) Inventor: Hao-Yun Ma, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/945,805

(22) Filed: Sep. 20, 2004

(65) Prior Publication Data

US 2005/0064753 A1   Mar. 24, 2005

(30) Foreign Application Priority Data

Sep. 19, 2003   (CN) .............................. 03279432 U

(51) Int. Cl.
*H01R 13/44*   (2006.01)
(52) U.S. Cl. ...................... 439/135; 439/41; 439/342; 439/940
(58) Field of Classification Search ................ 439/41, 439/135, 940, 342, 331, 71
See application file for complete search history.

(56) References Cited

U.S. PATENT DOCUMENTS

| | | | |
|---|---|---|---|
| 5,819,404 A | 10/1998 | Whiting | |
| 6,413,111 B1 | 7/2002 | Pickles et al. | |
| 6,533,592 B1 | 3/2003 | Chen et al. | |
| 6,547,609 B1 | 4/2003 | Howell et al. | |
| 6,554,624 B1 * | 4/2003 | Yu | 439/135 |
| 6,561,825 B1 | 5/2003 | McHugh et al. | |
| 6,572,383 B1 | 6/2003 | Yu | |
| 2003/0114036 A1 * | 6/2003 | Yu | 439/342 |

* cited by examiner

*Primary Examiner*—Tho D. Ta
*Assistant Examiner*—Felix O. Figueroa
(74) *Attorney, Agent, or Firm*—Wei Te Chung

(57) ABSTRACT

A land grid array (LGA) connector assembly (10) of the present invention includes an LGA connector (12) and a pick up cap (13) attached thereon. The LGA connector includes an insulative housing (20), a metal clip (24) pivotably mounted to the insulative housing and a lever (26). The pick up cap mounted on the connector defines a flat plate (32) and a first extending portion (34) extending from a end of the flat plate, at least part of the first extending portion extends into the plane in which the lever rotating around an axis from an open position to a closed position when the pick up cap mounted onto the connector. So the pick up cap can be lifted via putting up the lever, and the pick up cap can be detached from the connector conveniently and reliably.

9 Claims, 4 Drawing Sheets

LAND GRID ARRAY CONNECTOR ASSEMBLY WITH PICK UP CAP

BACKGROUND OF THE INVENTION

1. Field of the Invention

The present invention relates to a land grid array (LGA) connector assembly having comprising an LGA connector and a pick up cap, wherein is mounted on the connector for providing a flat top surface to be sucked by a vacuum suction device, whereby the LGA connector assembly can be moved onto a circuit substrate such as a printed circuit board (PCB) on which the connector is to be mounted.

2. Description of Related Art

On many production lines, electronic components such as land grid array (LGA) connectors are accurately positioned on circuit substrates such as printed circuit boards (PCBs) by means of vacuum suction devices. Such an LGA connector typically comprises an insulative housing, a plurality of electrical contacts received in the housing, a metal clip pivotably mounted to an end of the housing, and a lever pivotably mounted to an opposite end of the housing for engaging with the clip. The clip defines a generally rectangular window in a middle thereof. The contacts each have a first contact portions protruding outwardly from a top portion of the housing, for electrically connecting with a corresponding metal contact pad of an electronic package such as an LGA central processing unit (CPU). Because of this configuration of the LGA connector, a pick up cap has to be pre-attached on the top portion of the housing for providing a flat top surface. The pick up cap typically has a plurality of latches snappingly engaging with corresponding outer edges of the clip, thereby holding the pick up cap on the LGA connector. The pick up cap has a flat top surface. The vacuum suction device is then able to engagingly suck the flat top surface of the pick up cap, in order to reliably move and accurately position the LGA connector onto the PCB.

Referring to FIG. 4, a conventional land grid array (LGA) connector assembly 80 is illustrated. The LGA connector assembly 80 comprises an LGA connector 82 and a pick up cap 84 attached thereon. The LGA connector 82 comprises an insulative housing 822, a lever 824 pivotably mounted to the LGA connector 82, a metal clip 826 pivotably mounted to the insulative housing 822. The pick up cap 84 has a flat plate 842 for being sucked by a vacuum suction device, and a plurality of latches 8422 depending from the flat plate 842 for snappingly engaging with front edge and rear edge of the metal clip 826.

However, edges of the pick up cap 84 have no meas for detaching the pick up cap 84 from the connector 82, and the edges are too thin so that it is not convenient and reliable that a force is putted on the side edge of the pick up cap 84 to detach the pick up cap 84 from the LGA connector 82, a adding working procedure is needed to detach the pick up cap 84 from the LGA connector 8 and that reduces the efficiency.

In view of the above, a new land grid array connector assembly which overcomes the above-mentioned disadvantages is desired.

SUMMARY OF THE INVENTION

Accordingly, an object of the present invention is to provide a land grid array connector assembly which has an LGA connector and a pick up cap mounted on the connector, wherein the pick up cap can be detached from the connector conveniently and reliably.

To achieve the above-mentioned object, a land grid array connector assembly accordance with a preferred embodiment of the present invention comprises an LGA connector and a pick up cap attached thereon. The LGA connector comprises a base and a lever pivotally attached to a side of the base, the lever comprises a shaft rotatably mounted on the side of the base and a handle extending substantially perpendicularly from an end of the shaft and being rotatable around an axis of the shaft in a plane in which the lever is rotated; A pick up cap detachably mounts on the base and has a smooth top surface for being sucked by a vacuum sucking device, the pick up cap been provided with an engaging portion thereon; when the pick up cap mounts on the base, the engaging portion has a part thereof extended into said plane, thereby detaches the pick up cap away from the base as the handle is rotated to lift engagingly the engaging portion.

Other objects, advantages and novel features of the invention will become more apparent from the following detailed description when taken in conjunction with the accompanying drawings, in which:

DETAILED DESCRIPTION OF THE INVENTION

Reference will now be made to the drawings to describe the present invention in detail.

Figure 1:
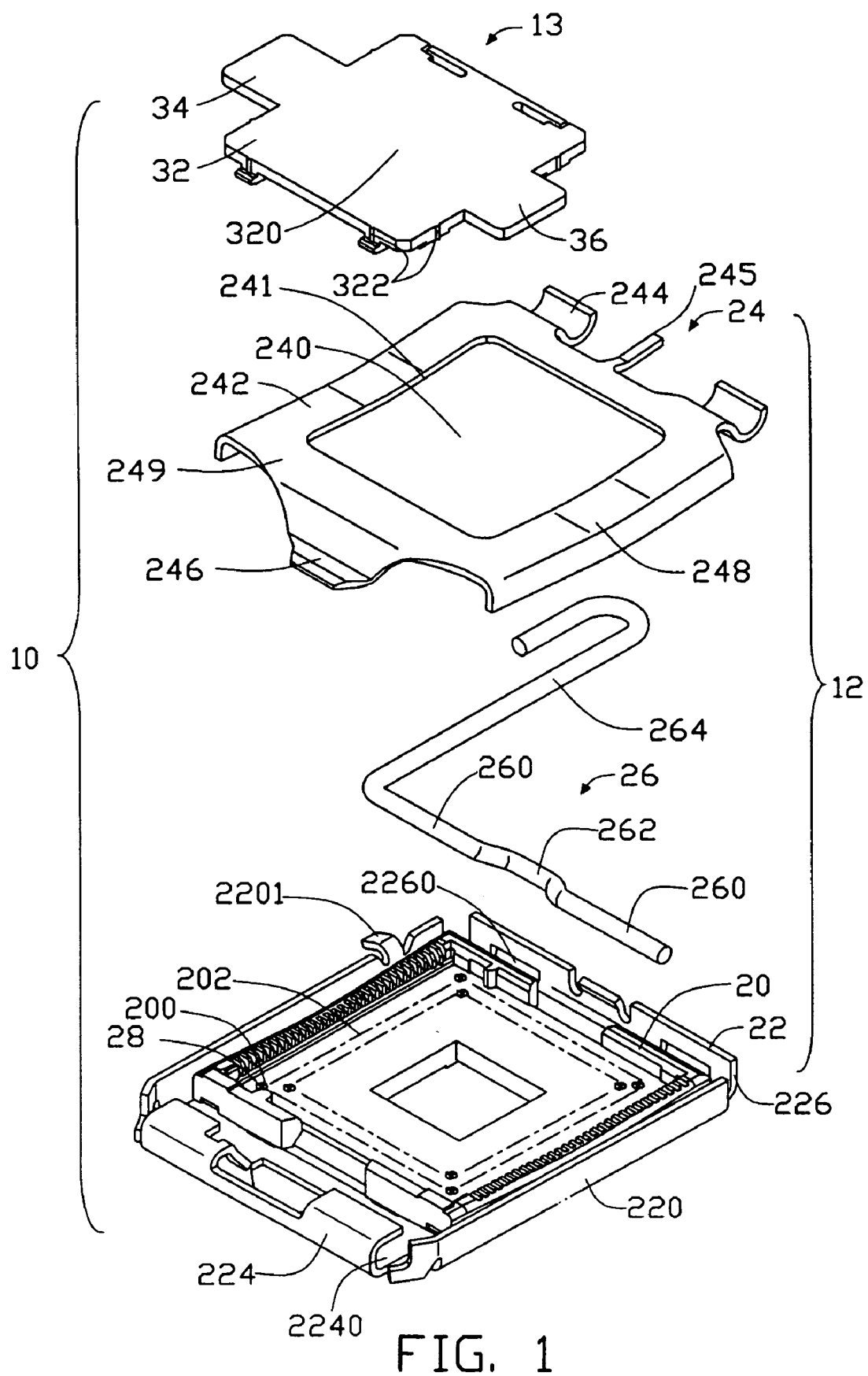
FIG. 1 is an exploded, isometric view of an LGA connector assembly in accordance with a preferred embodiment of the present invention, the LGA connector assembly comprising an LGA connector and a pick up cap be mounted on the connector.

FIG. 1 is an exploded isometric view of a land grid array connector assembly 10 in accordance with a preferred embodiment of the present invention. The connector assembly 10 comprises a land grid array connector 12 and a generally rectangular pick up cap 13. The pick up cap 13 is attached onto the connector 12, for providing a flat top surface to be sucked by a vacuum suction device. The LGA connector 12 can thereby be moved onto a circuit substrate (not shown), such as a printed circuit board (PCB), on which the connector 12 is to be seated.

The connector 12 comprises a base, the base defines a generally rectangular insulative housing 20, a plurality of contacts 28 received in the housing 20, a metal stiffener/frame 22 partly covering and reinforcing the housing 20, a metal clip 24 pivotably mounted onto an end of the stiffener 22, and a lever 26 pivotably mounted to an opposite end of the stiffener 22 for engaging with the metal clip 24.

The housing 20 defines a generally rectangular cavity 202 in a middle thereof. The cavity 202 is used for receiving an electronic package such as an LGA central processing unit (CPU) (not shown) therein. A multiplicity of passageways 200 is defined in a portion of the housing 20 under the cavity 202, the passageways 200 receiving a corresponding number of contacts 28 therein respectively.

The stiffener 22 comprises a pair of lateral sides 220 each having an L-shaped cross-section, a front end 224 having a U-shaped cross-section, and a rear end 226 having an L-shaped cross-section. The housing 21 is fittingly received in the stiffener 22. An elongate chamber 2240 is defined in the front end 224 of the stiffener 22. A pair of spaced slots 2260 is defined in the rear end 226 of the stiffener 22. An ear 2201 extends arcuately from an edge of one of the lateral sides 220 of the stiffener 22.

The lever 26 comprises a pair of locating portions 260 pivotably received in the chamber 2240 of the stiffener 22, an offset actuating portion 262 between the locating portions 260, and an operating portion 264 extending perpendicularly from an end of one of the locating portions 260. The operating portion 264 is disposed outside of the stiffener 22. When oriented at a horizontal position parallel to the top face of the housing 20, the operating portion 264 engages with the ear 2201.

The clip 24 defines a substantially plate configuration with a generally rectangular window 240 in a middle thereof and the window 240 defines a plurality of inner edges 241. The clip 24 comprises a pair of opposite lateral sides 242 and a pair of opposite ends 249 perpendicular to the lateral sides 242. The lateral sides 242 are each bent accurately towards the housing 20 in a middle thereof, for pressing the LGA CPU in the cavity 202. The bent lateral sides therefore each define a concave 248 thereof. The clip 24 also comprises an engaging portion 246 extending arcuately from an end thereof, a pair of spaced securing portions 244 extending arcuately from an opposite end thereof and pivotably received in the slots 2260 of the stiffener 22, and a tail 245 between the securing portions 244.

When the clip 24 is oriented at a horizontal position parallel to the top surface of the housing 20, the engaging portion 246 of the clip 24 engages with the actuating portion 262 of the lever 26 thereby pressing the CPU on the contacts 28. When the clip 24 is oriented at a position perpendicular to the top face of the housing 20, the tail 245 abuts against the stiffener 22 to prevent the clip 24 from being over-rotated.

Figure 2:
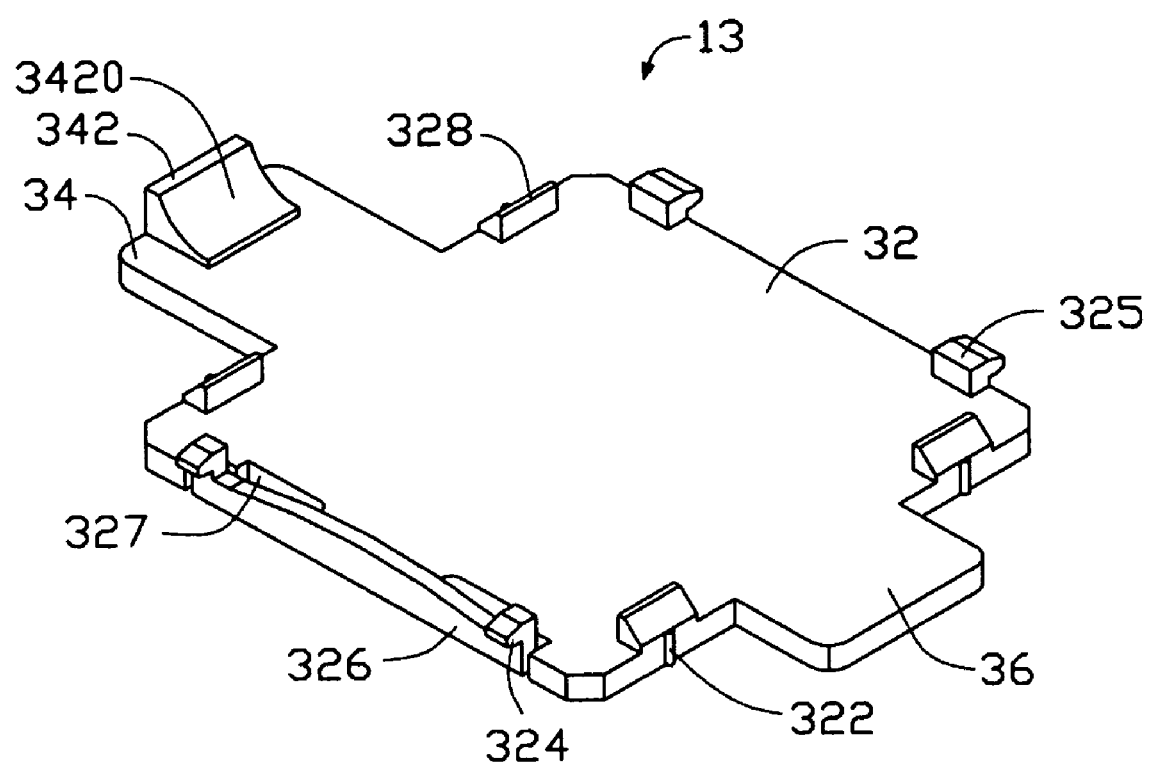
FIG. 2 is an isometric view of the pick up cap, but showing the pick up cap inverted.

Referring also to FIG. 2, the pick up cap 13 comprises a substantially rectangular flat plate 32 with a pair of opposite lateral sides and a pair of ends perpendicular to the lateral sides. A first extending portion 34 extending from a end of the flat plate 32 close to the lever 26 of the connector 12, a second extending portion 36 extending from the opposite end of the flat plate 32, and a part of the first extending portion 34 extending into a plane in which the lever 26 rotates around an axis of a shaft from an open position to a closed position when the pick up cap mounted onto the connector, includes a fastener 342 have a cambered surface 3420 for mating with the lever 26, the second extending portion 36 attached onto the concave 248 of the clip 24.

A pair of latches 324, 325 depends from each lateral side of the flat plate 32 respectively for snappingly engaging with the inner edges 241 of the metal clip 24. One of the lateral sides defines a T-shaped deforming portion 326. A pair of first latches 324 extends downwardly from the deforming portion 326. A pair of second latches 325 extends from the lateral side opposite to the deforming portion 326. The first and second latches 324, 325 each form a clasp 327 for mounting the pick up cap 13 onto the clip 24. Each edge of flat plate 32 has a plurality of protrusions 322 extending outwardly and laterally for engaging with a corresponding inner edge 241 of the window 240. Two guiding portions 328 are defined in a surface of the flat plate 32, in communicating with the edges of the opposite ends, for facilitating attachment of the pick up cap 13 onto the connector 12.

Figure 3:
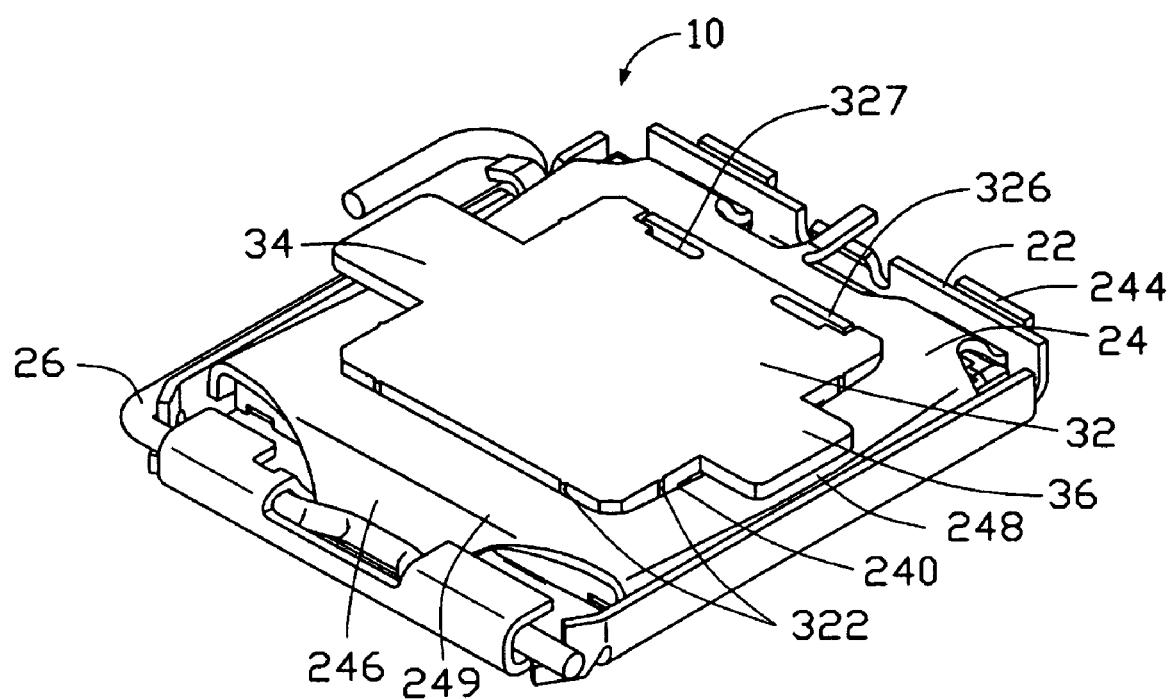
FIG. 3 is an assembled isometric view of the pick up cap and the connector of FIG. 1.
Figure 4:
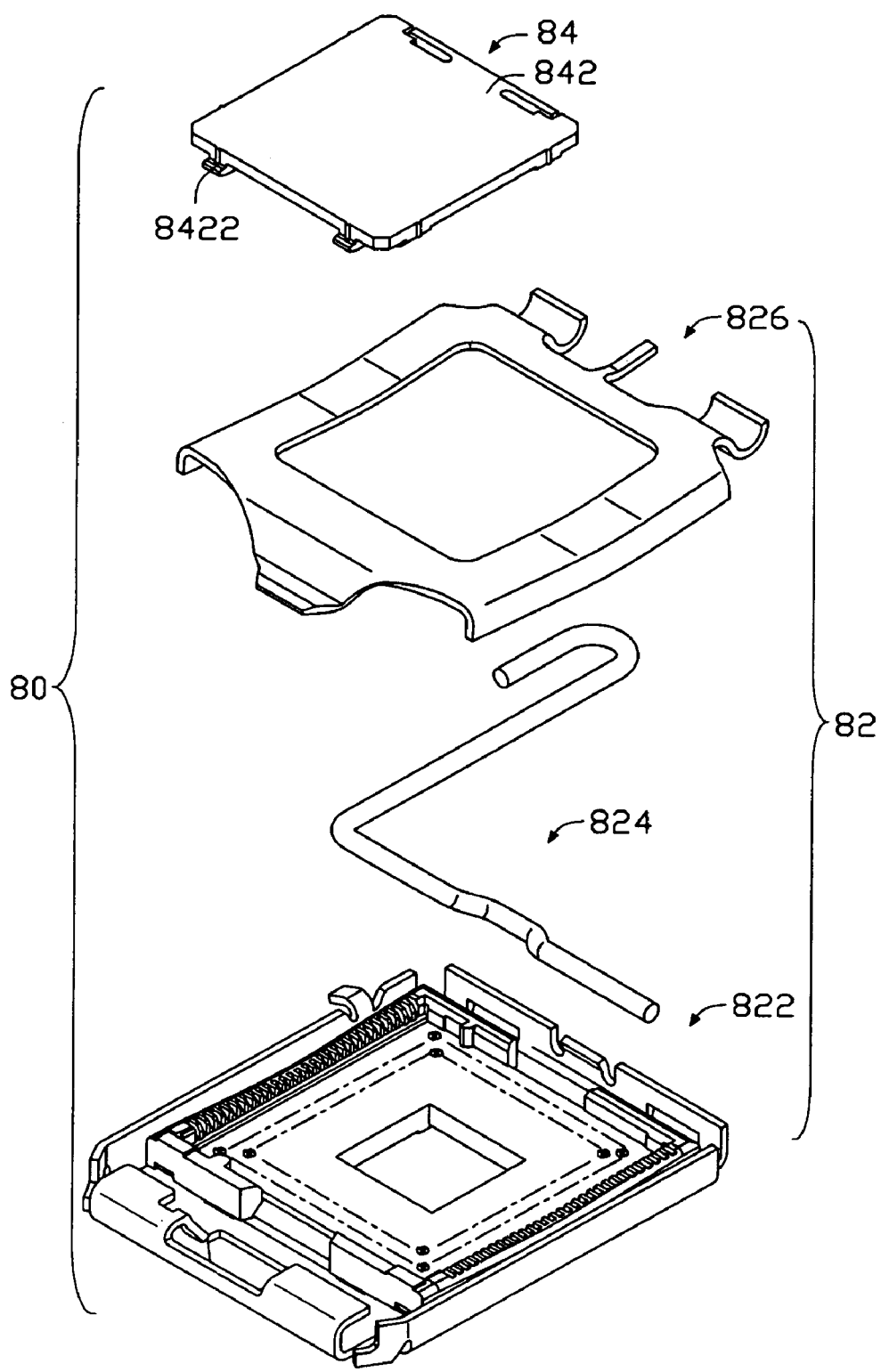
FIG. 4 is an exploded, isometric view of a conventional LGA connector assembly, showing a conventional pick up cap ready to be mounted onto a clip.

Referring to FIG. 3, in attaching the pick up cap 13 onto the connector 12, the pick up cap 13 is disposed over the connector 12, with the second latches 325 loosely clasping to a corresponding inner edge 241 of the window 240 and the first latches 324 loosely contacting with the opposite inner edge, the pick up cap 13 is pressed down, with the first latches 324 abut against the corresponding inner edge of the window 240. The first latches 324 elastically deflected inwardly. When the first latches 324 snappingly clasp the edges of the window 240, and the protrusions 322 abut against the corresponding edge of the window 240. The pick up cap 13 is thereby securely mounted on the connector 12.

Furthermore, the first extending portion 34 and the second extending portion 36 of the pick up cap 13 are attached in corresponding concave 248 of the clip 24. The first extending portion 34 extending outwardly from the clip 24 prevents the whole pick up cap 13 from going through the window 240. The lever 26 mates with a cambered surface 3420 of the fastener 342 of the first extending portion 34, thereby the pick up cap can suck the connector via mating with the lever and the clip. In this position, a vacuum suction device (not shown) can suck the top surface of the pick up cap 13 for moving the connector assembly 1 to a desired location on the PCB.

After the vacuum suction taked away from the connector assembly 1, the pick up cap 13 can be detached away from the clip 24 and will not fall off the connector 12 for the fastener 342 of the first extending portion 34 biting the lever 26, so the pick up cap 13 can be detached away from the connector 12 conveniently and reliably.

As appreciated from the foregoing description, the pick up cap 13 engages with the inner edges 241 of the clip 24. Therefore, the attachment of the pick up cap 13 onto the clip is reliable, even if the clip defines a slant front edge. Furthermore, the concave 248 of the lateral side 242 can receive the first extending portion 34 and the second extending portion 36 of the pick up cap 13, and the first extending portion 34 comprise the fastener 342 mating with the lever 26, therefore the pick up cap 13 can be detached away from the connector 12 conveniently and reliably via the lever lifts the first extending portion.

While a preferred embodiment in accordance with the present invention has been shown and described, equivalent modifications and changes known to persons skilled in the art according to the spirit of the present invention are considered within the scope of the present invention as defined in the appended claims.

What is claimed is:

1. An electrical connector assembly comprising:
an electrical connector having a base and a lever pivotally attached to a side of the base, said fever comprising a shaft rotatably mounted on the side of the base and a handle extending substantially perpendicularly from an end of the shaft and being rotatable around an axis of the shaft in a plane in which the lever is rotated; and
a pick up cap detachably mounted on the base and having a smooth top surface for being sucked by a vacuum sucking device, the pick up cap being provided with an engaging portion thereon;
wherein when the pick up cap is mounted on the base, said engaging portion has a part thereof extended into said plane, thereby detaching the pick up cap away from the base as the handle is rotated to lift engagingly said engaging portion.

2. The electrical connector assembly as claimed in claim 1, wherein the engaging portion of the pick up cap defines a fastener for mating with the lever.

3. The electrical connector assembly as claimed in claim 2, wherein the fastener of the pick up cap defines a cambered surface for mating with the lever.

4. The electrical connector assembly as claimed in claim 1, wherein the electrical connector further comprises a clip mounting on an opposite side of the base, and the clip defines a window.

5. The electrical connector assembly as claimed in claim 4, wherein side edges of the flat plate are formed with a plurality of latches for snappingly clasp the edges of the window.

6. The electrical connector assembly as claimed in claim 5, wherein each of the latches defines two side edges perpendicular to the engaging portion.

7. The electrical connector assembly as claimed in claim 4, wherein side edges of the flat plate define a plurality of protrusions for engaging with corresponding inner edges of the window.

8. An electrical connector assembly comprising:

an electrical connector having a base;

a lever and a clip respectively pivotally mounted to the base, said lever locking said clip in position;

the clip defining a window;

a pick up cap detachably mounted unto the window; wherein said pick up cap defines an extension located in a rotation path of said lever; whereby the pick up cap is detached from the clip when the lever is rotated to lift engagingly the extension.

9. A land grid array connector assembly comprising:

a lever and a metallic clip which can be downwardly pressed by said lever for securement consideration; and a pick up cap mounted on the clip, the pick up cap defining a flat plate and a extending portion extending from an end of the flat plate, a part of the extending portion being located on a moving path of the lever when the pick up cap is mounted onto the connector; whereby the pick up cap is detached from the clip, when the lever is moved to lift engagingly the extending portion.

* * * * *